United States Patent [19]

Sillner

[11] Patent Number: 4,495,973
[45] Date of Patent: Jan. 29, 1985

[54] DEVICE FOR RETAPING ELECTRICAL COMPONENTS

[76] Inventor: Georg Sillner, Buchenstrasse 23, 8411 Zeitlarn, Fed. Rep. of Germany

[21] Appl. No.: 437,469

[22] Filed: Oct. 28, 1982

[30] Foreign Application Priority Data

Dec. 10, 1981 [DE] Fed. Rep. of Germany ... 8135962[U]

[51] Int. Cl.³ ............................................. B21F 1/00
[52] U.S. Cl. .................................. 140/102; 140/71 R
[58] Field of Search .................... 140/71 R, 102, 105; 29/564.1, 741

[56] References Cited

U.S. PATENT DOCUMENTS

3,945,100   3/1976   Whiting et al. ..................... 140/105
4,166,312   9/1979   Harigane et al. ................... 140/105

Primary Examiner—Lowell A. Larson
Attorney, Agent, or Firm—Jacobs & Jacobs

[57] ABSTRACT

An apparatus retapes axially taped electrical components into quasi-radially taped component. The apparatus feeds the axially taped electrical components to a work station one-by-one, at which one pigtail or lead wire of each component is bent around a bending mandrel by means of a bending element protruding beyond a rotatably or swingably mounted carrier, so that, after bending, the component with U-shaped leads is held suspended from the bending mandrel on its bent lead wire. An inserter device transfers the component with the bent lead wire onto a receiver of a transport element by sliding the component held suspended on the bending mandrel onto the receiver of the transport element, which then stepwise transports each bent component away from the work station.

22 Claims, 12 Drawing Figures

DEVICE FOR RETAPING ELECTRICAL COMPONENTS

The present invention relates to an apparatus for retaping axially taped electrical components into quasi-radially taped components.

It is today generally customary for electrical components such as, for instance, resistors, capacitors or diodes which have two pigtails and in which the two pigtails protrude axially from the corresponding component or from the body or housing of the corresponding component to be delivered taped by the component manufacturer in such a manner that a plurality of components are held with the ends of their two pigtails on two parallel strips of paper or other suitable material. The individual components then, including their pigtails, lie in the manner of ladder rungs with respect to the two strips forming the taping. Such taped components are referred to hereinbelow as "axially taped components".

Particularly for the automatic equipping of circuit boards (for instance, printed circuits) it is necessary as a rule that the electrical components be fastened or taped to a single strip or a single tape in such a manner that the free ends of the two pigtails of each component extend in one and the same direction, and that these free ends of the components are fastened to one lengthwise side of the individual strip or tape and otherwise protrude beyond said lengthwise side. Such taped components will be referred to hereinbelow as "quasi-radially taped components".

The object of the invention is to provide a device by which the wrapping of axially-taped components into quasi-radially taped components is possible with simple means and which furthermore provides assurance that the taped components fully and completely meet the required narrow limits of tolerance with respect to their positioning on the individual tape and with respect to the shaping of their pigtails so that the wrapped components are actually also suitable for the automatic equipping of electric circuits.

In order to achieve this purpose, a device of the aforementioned type is developed in accordance with the invention in such a manner that a first work station is provided, which is arranged fixed in space and is intended for the feeding of the axially-taped components and for bending over at least one of the pigtails of these components, a transport element having receivers for the components is moved stepwise past said work station, the first work station has a bending mandrel (first pin) which is held or fastened preferably only at one end and the axis of which is approximately parallel to a preferably horizontal axis in space which is transverse to the direction of movement of the transport element and/or receivers; a carrier is mounted for swinging or turning around an axis approximately parallel to the said axis in space on the first work station, the carrier having on a side facing the transport element a protruding bending element which is staggered with respect to the first pin or bending mandrel, said element forming a mating surface for the bending; an inserter is provided at the first work station, which forms a resting surface for the components which face the transport element, beyond which surface one end of the bending mandrel protrudes; the inserter (39) is displaceable in the direction of said axis in space from a position of rest lying remote from the transport element into a working position lying adjacent the transport element or the corresponding receivers; and means, for instance knife elements for cutting the axially-taped components from the taping, are provided at the first work station.

In the apparatus of the invention, one pigtail of each component is first separated from the taping at the first work station by the aforementioned means for the separating of the components and thereupon this pigtail is bent around the bending mandrel by means of the bending element.

After the separation of the second pigtail from the corresponding taping, the component is then pushed laterally into a ready receiver of the transport element by means of the inserter and/or the resting surface of said inserter, the component in question upon said insertion having its pigtail which had been bent in hooked shape guided hangingly and slidingly on the first pin or bending mandrel which preferably extends in horizontal direction, until the component in question has arrived laterally into a ready receiver of the transport element.

In a preferred embodiment of the apparatus, the carrier which has the bending element is fastened to a first carriage which is displaceable in the direction of said axis in space from a position of rest, in which the carrier is at a greater distance from the transport element, into a working position in which the above-mentioned bending of the one pigtail takes place and in which the carrier is at a smaller distance from the transport element. The inserter is in this connection preferably fastened to a second carriage which is also displaceable in the direction of the said axis in space.

The transport element is preferably provided at each receiver with a laterally protruding holding element having a surface which is aligned with or at the same level as that surface of the bending mandrel on which that pigtail of the component which has been bent into hook shape is guided in hanging or sliding fashion. Both the bending of the one pigtail and the transfer after bending of the component in question into the receiver of the transport element take place therefore in the apparatus of the invention by simple means and in particular also without any turning or tilting of the component in question being necessary. The same mandrel or pin used for the bending serves to guide the component upon transfer to the transport element. Furthermore, with the apparatus of the invention, the bending of the one pigtail of each component can take place in the same plane in which said pigtail lies upon the feeding of the component in question to the first work station.

In the apparatus of the invention the transport element is preferably formed of a turn-table or transport-table which is preferably turnable stepwise around a vertical axis and which has the said receivers (preferably with the holding elements) at its outer circumference.

In a preferred embodiment of the apparatus of the invention, the first work station is followed on the machine frame by a second work station in which the pigtails of the components held in the transport element are bent or shaped in a predetermined manner. This second work station then has, for instance, a third pusher which is movable transverse to the direction of movement of the transport element from a position of rest into a working position, and at least one bending tool, for instance a pincer element having a forming surface developed, for instance, by a projection, the forming surface being movable in direction transverse to the direction of displacement of the third pusher. By means of this forming surface, a pigtail can then be bent in the desired manner, for instance into S-shape, or else provided with an offset, for instance by simultaneous use of resting surfaces or mating surfaces on the transport element and/or on the second work station.

Further developments of the invention form the subject matter of the appended claims.

The invention will be described in further detail below on an illustrative embodiment with reference to the Figures in which FIG. 1 diagrammatically shows an apparatus in accordance with the invention, in top view.

Figure 11:
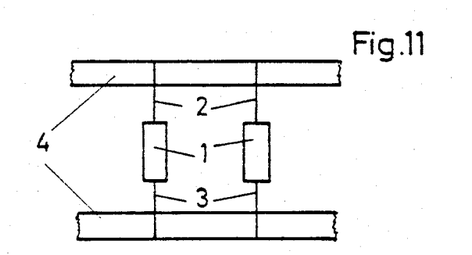
FIG. 11 shows several components with the taping, as they are fed to the apparatus.

In the Figures, 1 are electrical components, for instance electric resistors, which are fed to the apparatus with taping corresponding to FIG. 11, i.e. the pigtails 2 and 3 which extend axially from the components 1 are fastened at each of their ends to strips 4 respectively, for instance of paper, which extend approximately parallel to each other in such a manner that the components together with their pigtails 2 and 3 lie in the form of rungs on the two strips 4 which form the taping.

Figure 12:
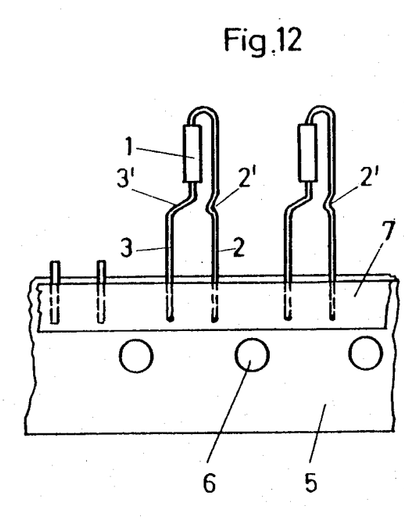
FIG. 12 shows the same components after taping in the apparatus.

By means of the apparatus shown in the Figures, these axially-taped components 1 are to be so taped that, as shown in FIG. 12, they are held by both pigtails 2 and 3 on one longitudinal side of a single strip of strip 5, preferably also of paper, and that these components 1 and their pigtails 2 and 3 protrude in a precisely predetermined position and at a precisely predetermined distance apart from the one longitudinal side of the strip 5. It is also essential in this connection that, after the taping by the apparatus, the pigtails 2 and 3 have a precisely predetermined shape. The attachment of the components 1 and/or their pigtails 2 and 3 to the strip 5, which is provided with equally spaced perforation holes 6, is effected for instance by means of an adhesive tape 7.

In the apparatus shown in FIGS. 1 to 10, a mandrel 9 which is turnable around a vertical axis is provided on the substantially horizontal top surface of a machine frame 8, the mandrel 9 protruding above said surface, and on which mandrel there can be placed a spool 10 which contains in wound-up form the taped components 1 in accordance with FIG. 11. The axially-wrapped components 1 (in accordance with FIG. 11) are withdrawn from the spool 10 in the direction indicated by the arrow A, the pigtails 2 and 3 of the individual components being perpendicular to the surface of the machine table 8, i.e. perpendicular to the plane of the drawing of FIG. 1.

The components 1 which are removed from the spool 10 together with the taping formed by the two strips 4 are fed via a guide 11 to the first work station 12.

In the region of the guide 11 there are provided drive means 13 which see to it that the feeding of the taped components 1 to the work station 12 takes place in each case in synchronism or in an intermittent movement, i.e. with a movement such that after each movement step there is a certain standstill period. These means 13 are formed for instance by at least one gearwheel into which the pigtails 2 and/or 3 of the components engage and which is driven in synchronism or intermittently by a drive, not shown in detail.

At the work station 12, the upper pigtail 2 of each component 1 fed is first of all removed from the upper strip 4. Thereupon the pigtail 2 is bent in such a manner that the free end of this pigtail is directed downward and lies approximately parallel to the pigtail 3. As soon as this bending of the pigtail 2 has been effected, the component is transferred to the transport plate 14, in which connection of course also the separating of the pigtail 3 from the lower strip 4 takes place.

The transport plate 14 carries out a synchronized movement in the direction of the arrow B around a vertical pin 15, i.e. a pin extending perpendicular to the surface of the machine table 8, this movement taking place synchronously with the conveying action of the conveyor means 13, i.e. whenever a component is ready at the work station 12 for transfer to the transport plate 14, the latter has previously advanced one work step.

The transport plate 14 moves the components held on its outer periphery first of all past the second work station 16 where the pigtails 2 and 3 which are still essentially linear are straightened and shaped in a given predetermined manner. In the embodiment shown in the Figures, this shaping takes place in a manner such that the pigtail 2 has a substantially triangular offset and a section of the pigtail 3 which is in the vicinity of the component 1 is bent substantially into an S shape, the free ends of the two pigtails 2 and 3 extending parallel to each other.

After this shaping, the components 1 are fed by the rotating transport plate 14, finally, to a third work station 17 in which the components 1 are then taped on the strip 5 in a manner corresponding to FIG. 12. For this purpose, the work station 17 is fed from a roll 18 of strips 5. The work station 17 receives an adhesive tape 17 from another roll (not shown in detail), by which adhesive tape the components are fastened to the strip 5.

After the taping to the strip 5, the components 1 are wound together with the strips on a spool 19 which in the same way as the spool 18 is mounted for rotation around a vertical axis on the machine table 8.

In order to avoid having the components 1 of different layers of the spool 19 hook into each other, a strip shaped interlayer 20, obtained from a spool 21, is wound onto the spool 19 together with the taped components 1.

FIGS. 2 to 7 show the first work station 12 and parts thereof in detail.

The first work station 12 consists essentially of two carriages 22 and 23 which are displaceable parallel to the surface of the machine table 8, in each case radially to the transport plate 14.

Both carriages are guided in a guide block 24 which is fastened to the machine table 8 and which so surrounds the carriages 22 and 23 that the latter can carry out only the desired movement radial to the transport plate 14. For ease of presentation, the guide block 24 has been shown as a single part in the Figures. In a practical embodiment of the apparatus of the invention, this guide block, however, may also be formed of several parts.

The first carriage 22 is provided, in the direction radial to the transport plate 40, with a continuous borehole 25 within which a shaft 27 is mounted by means of ball bearings 26 around a horizontal axis extending radial to the transport plate. On the end of the shaft 27, which is remote from the transport plate 14 and protrudes over the carriage 22, the shaft bears a toothed belt drive 28 by which the shaft 27 is driven through a predetermined angle by means of a toothed belt 29 and a drive (not shown in detail).

On its end which faces the transport plate 14 and is aligned with the surface of the carriage 22 there, the shaft 27 bears two pins 30 and 31 which protrude freely from this end of the shaft 27. The pin 30, which is of greater length than the pin 31, is co-axial to the axis of the shaft 27. Although the pin 31 is parallel to the axis of the shaft 27, it is however staggered laterally from the axis of the shaft 27. The two pins 30 and 31 have approximately the same cross-section.

At its top, the carriage 22 bears a knife 32 which is fastened above a spacer block 33 in such a manner that the knife lies above the upper surface of the guide block 24 or slides on the upper surface of said guide block. It is self-evident that a slot-shaped recess in the guide block 24 is provided for the spacer block 33 so that the knife 32 together with the carriage 22 can be moved radial to the transport plate 14, i.e. in the direction indicated by the double-ended arrow C in FIGS. 2 and 5.

The knife 32 is provided at the end thereof lying adjacent to the transport plate 14 with a cutting edge 34 with which there is associated a mating cutting edge 35 on a slab element 36 which is fixed in space.

This slab element 36 consists essentially of two parts 36' and 36" which form the arm elements of a clamp- or fork-shaped structure, i.e. the part 36' on which the mating cutting edge 35 is provided, has, on the side thereof facing the guide block 24, a flat surface 37 which lies opposite also a flat surface 38 on the part 36", so that the parts 36' and 36" together form a channel which is limited laterally by the said surfaces 37 and 38 which extend perpendicular to the surface of the machine table 8. The width of this channel or the distance apart of the surfaces 37 and 38 is approximately equal to or slightly greater than the diameter of the upper pigtail 2. As can be noted in particular from FIGS. 2 and 3, this channel which is defined laterally by the surfaces 37 and 38 is open both on bottom and on top so that the components 1 which are fed to the work station 12 and taped in accordance with FIG. 11 have the upper end of the pigtails 2 protruding upward from the channel formed by the surfaces 37 and 38 and the upper strap or upper strip 4 also lies outside the said channel. In this way it is possible, by means of the two cutting edges 34 and 35 to separate the upper pigtail 2 from the upper strip 4, the part of the upper pigtail which is held on the upper strip 4 remaining on said strip. At the left end as seen in FIG. 3, the two parts 36' and 36" are connected with each other and with the guide block 24, this point of connection being arranged at a distance from the axis of the shaft 27 and of the pin 30 which is sufficiently great so that the pigtail 2 separated from the upper strap or strip 4 can be bent within the channel formed by the surfaces 37 and 38 in the direction indicated by the arrow D of FIG. 3. Upon this bending, the end of the pigtail 2 which is free after the cutting describes the path of a circular arc around the pin 30, as indicated in FIG. 3 by the interrupted line E. The channel formed by the surfaces 37 and 38 prevents the pigtail 2 from extending laterally upon the bending. It is self-evident that the said channel is opened for the components 1 entering the work station 12, i.e. on the right hand side as seen in FIG. 3.

On the second carriage 23, which is also displaceably guided in the direction indicated by the double arrow C within the guide block 24 in horizontal direction, there is fastened an inserter 39 which is also developed as a fork- or clamp-shaped element and consists of two plate-shaped parts 39' and 39". The part 39' has a surface 40 which extends perpendicular to the top of the machine table 8 and is located opposite and spaced from a surface 41 on the part 39" which also extends perpendicular to the surface of the machine table 8. The two surfaces 40 and 41, which in the same manner as the surfaces 37 and 38 are perpendicular to the direction or movement of the carriages 23 and 22, form with each other a channel which is open towards the top, towards the bottom and towards the inlet side of the components 1, i.e. towards the right in the showing selected in FIG. 3. The width of this channel formed by the surfaces 41 and 40 is equal to or somewhat larger than the diameter of the components 1.

As can be noted in particular from FIG. 2, the inserter 39 lies below the slab element 36 in such a manner that in the normal position or position of rest of the carriage 23 or inserter 39, the channel formed by the surfaces 37 and 38 is continued downward within the channel formed by the surfaces 40 and 41. The parts 39' and 39" of the inserter 39 are connected at their left end, as seen in FIG. 3, to each other and to the carriage 23, this point of connection being shifted in the showing selected for FIG. 3 so far to the left with respect to the axis of the shaft 27 and of the pin 30 that when the upper pigtail 2 is bent, its free end can move on the circular path E up through the channel formed by the surfaces 40 and 41.

Figure 7:
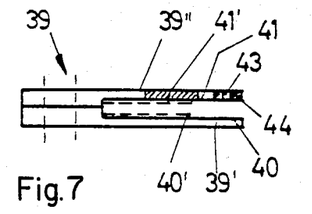
FIG. 7 is a top view of the inserter of the work station.

In order to obtain satisfactory guidance when bending the pigtail 2 for said pigtail also in the region of the channel formed by the surfaces 40 and 41, it is advantageous to develop the surfaces 40 and 41 stepwise in such a manner that said channel in the left hand portion thereof, as seen in FIG. 3, still only has a width which corresponds to the width of the channel formed by the surfaces 37 and 38, as indicated in interrupted lines in FIG. 7. The steps 40' and 41' of the surfaces 40 and 41 respectively then preferably lie directly in the vicinity of the pin 30 and can serve in this connection as additional stop for the corresponding component 1.

Figure 2:
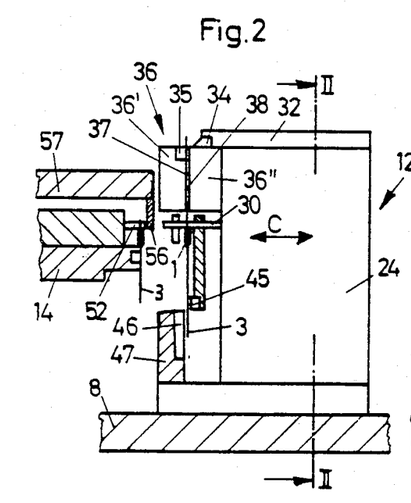
FIG. 2 is a side view of the first work station for separating the axially-taped components, for bending in each case of one pigtail of said components and for inserting the components into the transport table, together with a partial view of said transport table.
Figure 3:
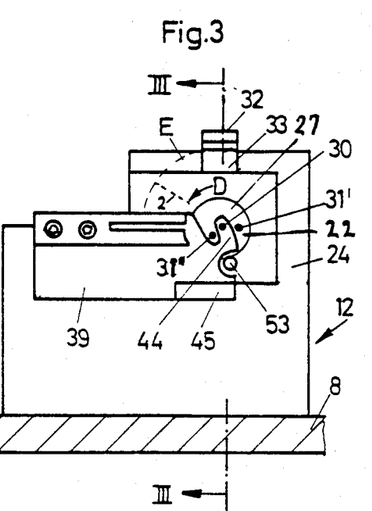
FIG. 3 is a view showing the first work station in accordance with FIG. 2, seen from the side of the transport plate.
Figure 4:
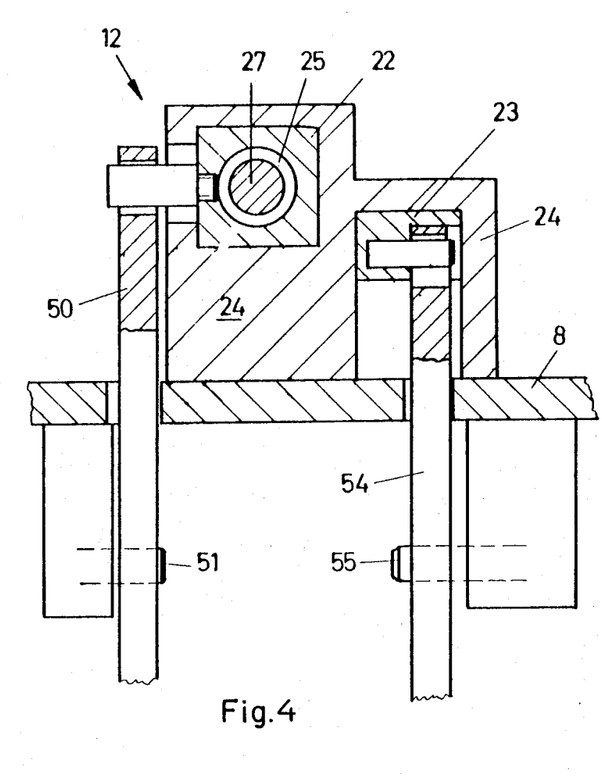
FIG. 4 is a sectional view along the line II—II of FIG. 1.
Figure 5:
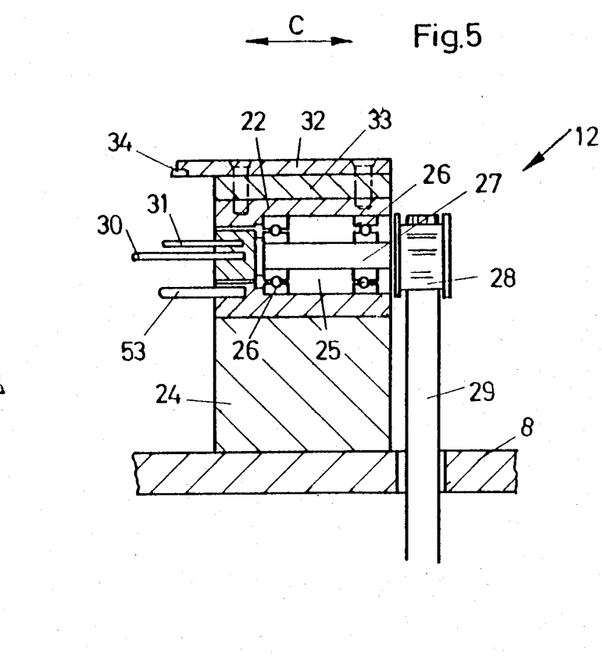
FIG. 5 is a sectional view along the line III'1III of FIG. 3.
Figure 6:
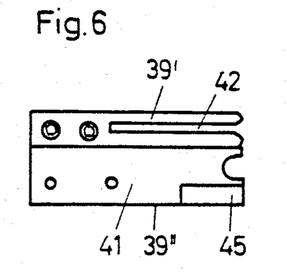
FIG. 6 shows in detail a side view of the inserter of the first work station.

As shown in particular by FIGS. 2, 6 and 7, the part 39' has an opening formed by a continuous horizontal slot 42, this slot being open on its right hand side as seen in FIG. 3, i.e. the side facing the guide element 11. The part 39" has an opening formed by a borehole 43. The pin 30 passes through both openings 42 and 43. The borehole 43 is provided in an eye 44 of the part 39". The pin 31 can, upon rotation of the shaft 27 in the direction of the arrow D in FIG. 3, carry out through this eye 44 a rotation of more than 180°, i.e., for instance, a rotation on the order of magnitude of 240° around the borehole 43 from the right hand position 31' as seen in FIG. 3 into the left hand position 31" as seen in FIG. 3 even if the free end of the pin 31 extends into the channel formed by the surfaces 40 and 41. The free end of the pin 31 extends into this channel when the carriage 22 is in its working position, i.e. in the position adjacent the transport plate 14.

To the lower longitudinal edge of the part 39" which lies adjacent the guide block 24 there is fastened, below the pin 30, a cutting edge 45 with which there is associated a mating cutting edge 46 on a slab 47 which is fixed in space. The lower pigtail 3 as seen in FIG. 11 is separated by the cutting edges 45 and 46 from the lower strip 4 or the lower strapping.

Figure 1:
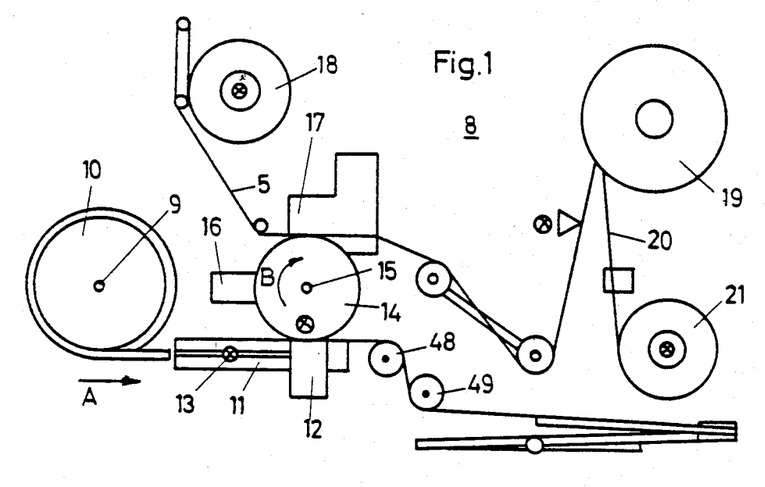

The strips 4 with the parts of the pigtails 2 and 3 remaining on these strips are removed towards the right over rollers 48 and 49 in the case of the viewing of the work station 12 selected for FIG. 1.

The manner of operation of the work station 12 can be described as follows:

Whenever a component 1 taped on the strips 4 is brought up, the two carriages 22 and 23 are in their position of rest, i.e. in a position in which these carriages are at the greatest distance from the transport plate 14. The component 1 which has been brought up passes into the channel formed by the surfaces 40 and 41 of the inserter 39, the upper pigtail 2 (with the exception of the end thereof fastened to the strip 4) coming to lie in the channel formed by the surfaces 37 and 38. The free end of the pin 31 is still outside the channel formed by the surfaces 40 and 41 while the pin 30 already extends through the opening 42 and 43 and thus lies crosswise to the channel formed by the surfaces 40 and 41. The component 1 fed has its upper pigtail resting against this pin 30, directly at the point of transition between the pigtail 2 and the component 1.

By means of a swing lever 50 which is swung around its horizontal swivel axis 51 by a drive not described in detail, the carriage 22 is first of all swung from its position of rest into the working position, as a result of which the free end of the pin 31 enters the channel formed by the surfaces 40 and 41. The pin 31 has thereby assumed the position designated 31' in FIG. 3. By the movement of the carriage 22 the upper end of the pigtail 2 is separated by means of the knife 32 from the strip or strap 4 present there. Now, by means of the toothed belt 29 the shaft 27 is turned in the direction indicated by the arrow D in FIG. 3. In this way the upper pigtail 2 is carried along by the pin 31 and bent around the pin 30. The rotation of the shaft 27 is stopped when the pin 31 is in the position indicated by 31" in FIG. 3. The upper pigtail 2 is then bent 180° around the pin 30.

If the carriage 22 is in its working position, then the free end of the pin 30 abuts against the free end of a holding pin 52 which is provided on the transport plate 14 and protrudes to the side radially from this transport plate. It is self-evident that a large number of such holding pins 52 are provided on the transport plate 14 at a distance apart from each other which corresponds to one step of the transport plate 14.

In order to assure satisfactory bending of the upper pigtail 2, i.e. to prevent the component 1 from moving away upon the bending of the upper pigtail 2, an additional pin 53 is provided on the carriage 22 below the shaft 27 and the pins 30 and 31, which additional pin—when the carriage 22 is in its working position—forms an abutment for the lower pigtail 3, i.e. the lower pigtail 3 rests against it upon the bending of the upper pigtail 2, also directly at the point of transition between said pigtail and the component 1. Due to the fact that the two pins 30 and 53 upon the bending of the upper pigtail 2 rest against the pigtails 2 and 3 respectively directly at the point of transition to the component 1, not only is there assured a firm support for the component 1 during the bending but at the same time assurance is provided as a result of the pin 30 that the bending of the upper pigtail of each component 1 takes place in each case at the same place referred to the component.

After the bending of the pigtail 2, the carriage 23 is moved from its position of rest into the working position by means of a swing lever 54 which is driven by a drive, not shown in detail, and is swingable around the horizontal pivot pin 55. As a result, the inserter 39 moves in the direction of the axis of the pin 30, to the left in the showing selected for FIG. 2, as a result of which the component 1 having the bent pigtail 2 is pushed by the pin 30 onto the holding pin 52 and is thus held suspended from the holding pin 52 of the transport plate 14. An annular guide path 56 which surrounds the transport plate 14 in the region of the holding pin 52 and is fastened to a platelike part 57 which is fixed in space prevents the components 1 which have been transferred to the holding pin 52 from sliding down laterally off of these holding pins during the rotation of the transport plate 14. It is clear that the guidepath 56 is interrupted over a short distance in the region of the work station 12, i.e. in the region in which the components are transferred to the transport plate 14.

Figure 8:
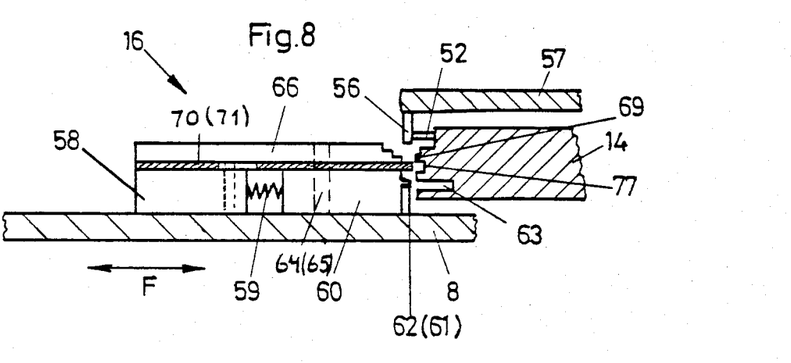
FIG. 8 is a longitudinal section through the second work station for the shaping of the pigtails of the components, together with a partial view of the transport plates.

The work station 16 for the shaping of the pigtails 2 and 3 has a drive block 58 which is movable back and forth in the direction of the double headed arrow F of FIG. 8 in horizontal direction and radial to the transport plate 14 by means not shown in detail. The drive block 58 acts via a compression spring 59 on a guide block 60 which is also guided for displacement in the direction of the double ended arrow F on the top of the machine table 8.

The guide block 60 is provided on the end thereof facing the transport plate 14 with two projections 61 and 62 which are at a distance apart from each other which corresponds to the distance which the free ends of the pigtails 2 and 3 are to be from each other after the taping on the strip 5. As soon as the guide block 60 has been displaced by the drive block 58 into its working position, i.e. into its position lying closest to the transport plate, the projections 61 and 62 extend into an annular circumferential groove 63 which is provided in the transport plate 14 below the holding pins 52.

A clamping plate 66 which has two projections 67 and 68 on the end thereof facing the transport plate 14 is connected to the guide block 60 by two pivot pins 64 and 65. Said projections are at a distance apart from each other which is approximately equal to the diameter of the pigtail 3, so that the pigtail 3 is held between the two projections 67 and 68 when the guide block is in the working position and the two projections 67 and 68 rest against the circumferential surface or against a cylindrical part 69 of the circumferential surface of the transport plate 14. This cylindrical part 69 lies below the holding pins 52 and below semi-circular receiving pockets which are provided in the transport plate 14 to receive the components 1 and one of which is associated with each holding pin 52.

A bending or pincer element 70 or 71 is swingably mounted on each vertical pivot pin 64 and 65 between the clamping plate 66 and the guide block 60, each pincer element having an opening 72 and 73 respectively which forms a connecting link guide into which openings the pins 74 and 75 respectively extend from the bottom. The two pins 74 and 75 are fastened in the drive block 58.

The manner of operation of the work station 16 can be described as follows:

As soon as the transport plate 14 has brought a component 1 to the work station 16, the drive block 58 is moved, during the time that the transport plate 14 is stopped, to the right in the case of the showing selected in FIG. 8, as a result of which the projections 67 and 68 of the clamping plate 66 are brought, via the compression spring 59, the guide block 60 and the pivot pins 64 and 65, against the cylindrical part 69 of the transport plate 14 and fix the corresponding component on the pigtail 3. The projections 61 and 62 then extend into the groove 63.

The movement of the guide block 60 and of the parts connected with said guide block towards the right in the direction of the double ended arrow F is concluded as soon as the projections 67 and 68 rest against the cylindrical part 69.

Upon further movement of the drive block 58 towards the right, which is possible due to the compression spring 59, the pins 74 and 75 move in the openings 72 and 73. Since the slot-shaped opening 73 extends at its left-hand end, as seen in FIG. 9, in the direction of the movement of the drive block 58, this further movement of the drive block 58 has initially no effect on the pincer element 71 provided with the opening 73.

Figure 9:
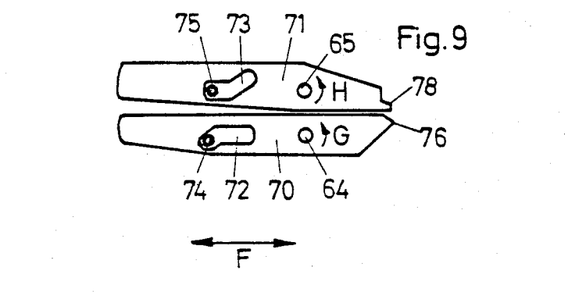
FIG. 9 is a top view of the pincer arrangement used in the second work station.
Figure 10:
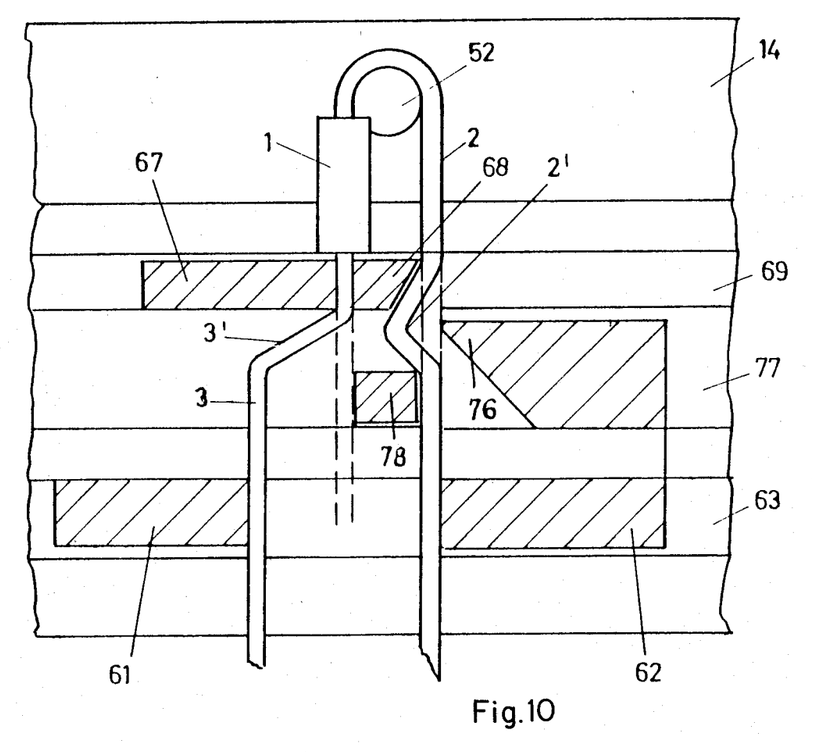
FIG. 10 shows on a large scale a component held on a pin of the transport plate together with the resting or forming surfaces formed in part on the transport plate and in part by the second work station, the said surfaces being emphasized in FIG. 10 by the hatching.

The opening 72 in the pincer element 70 however extends at its left end, as seen in FIG. 9, obliquely to the direction of movement of the drive block 58 so that this pincer element, upon further movement of the drive block 58 around the pivot pin 64, is swung counter-clockwise in the showing selected in FIG. 9, i.e. in the direction of the arrow G. A projection 76 which is provided on the pincer element 70 and which extends into a groove 77 of the transport plate 14 when the guide block 60 is in its working position, bends the pigtail 2 to the left in the showing selected in FIG. 10. Since the edge of the projection 76 which rests against the pigtail 2 is triangular and since the pigtail 2 on the side thereof facing away from the projection 76 rests at the same time against an oblique edge 68' of the projection 68 as well as against a projection 78 on the pincer element 71 which also extends into the groove 77, the aforementioned triangular offset 2' is impressed in the pigtail 2 by the swinging movement of the pincer element 70 around the pivot pin 74. In this shaping the lower end of the pigtail 2 as seen in FIG. 10 is guided and held between the projection 58 and the projection 62.

The shaping of the pigtail 2 is completed as soon as the pin 74 has entered into that part of the opening 72 which extends parallel to the direction of movement of the drive block 58. At this moment the pin 75 enters into that part of the opening 73 which is oblique to the direction of movement of the block 58, as a result of which the pincer element 71 is swung also in counter-clockwise direction around the pivot pin 65 in the showing selected in FIG. 9, i.e. in the direction of the arrow H. The side of the projection 78 which is remote from the projection 76 now grasps the pigtail 3 and presses this pigtail towards the left in the showing selected for FIG. 10, the pigtail 3 resting, on the one hand, against the projection 67 and, on the other hand, against the projection 61 so that the aforementioned S-shaped deformation of the pigtail 3 is obtained in the region 3'.

Thereupon the drive block 58 moves back into rest position, i.e. to the left in the showing selected in FIG. 8, as a result of which the pincer elements 70 and 71 first of all swing back into their initial position whereupon the guide block 60 and the clamping plate 68 release the corresponding component on the transport plate 14. The transport plate 14 can then be moved further by an additional step and the pigtails 2 and 3 of another component 1 which has been fed can be bent and shaped in the manner described.

The transfer and fastening of the components 1 in the work station 17 to the strip 5 or to said strip take place with customary known means which do not form an object of the present invention.

The invention has been described above with reference to an illustrative embodiment. It is clear that changes in modifications are possible without thereby going beyond the basic concept of the invention.

I claim:

1. Apparatus for retaping axially taped electrical components having pigtails into quasi-radially taped components, which comprises a machine frame, a first work station arranged fixed in space on said machine frame, means for stepwise feeding said axially taped components to said first work station, bending menas at said first work station for bending at least one pigtail of said axially taped components, transport means for stepwise transport of bent components away from said first work station, said bending means including a bending mandrel having an axis which lies approximately parallel to an axis in space that extends transverse to the direction of movement of said transport means, a carrier at the first work station swingably mounted about an axis extending in the direction of said axis in space, said carrier bearing, on a side facing the transport means, a protruding bending element which is staggered from the bending mandrel and which forms a mating surface for the bending mandrel, inserter means at said first work station for inserting a bent component into said transport means, said inserter means including a component resting surface, said resting surface facing said transport means with one end of said bending mandrel protruding beyond said resting surface, said inserter means being displaceable in the direction of said axis in space from a rest position lying remote from said transport means to a work position lying adjacent to said transport means, and cutting means at said first work station for cutting said axially taped components from said taping.

2. Apparatus according to claim 1, wherein said carrier is swingably or turnably mounted on a first carriage which is displaceable in the direction of said axis in space.

3. Apparatus according to claim 2, wherein said bending element has a dimension in the direction of said axis in space such that said bending element protrudes beyond said resting surface when said first carriage is in its work position.

4. Apparatus according to claim 2, wherein said inserter means is fastened to a second carriage which is movable in the direction of said axis in space.

5. Apparatus according to claim 1, wherein said transport means is a rotary transport plate which is rotatably mounted on said machine frame.

6. Apparatus according to claim 1, wherein said transport means includes a plurality of receivers for carrying said axially taped carriers, said receivers being provided with a holding element having a surface aligned with said bending mandrel.

7. Apparatus according to claim 2, wherein a shaft is swingably mounted on said first carriage, said shaft having said bending element on one end thereof.

8. Apparatus according to claim 7, wherein said bending mandrel is fastened to said first carrier and is co-axial with the axis of rotation of said shaft.

9. Apparatus according to claim 1, wherein said inserter means has a first part forming said resting surface with a borehole therein, said bending mandrel being a first pin extending through said borehole.

10. Apparatus according to claim 9, wherein said inserter means has a second part located at a distance from said first part, said second part having a slot-shaped opening which is open towards one end and the length of which lies in the direction of movement of the transport means.

11. Apparatus according to claim 10, wherein said first and second parts are plate-shaped parts which form a channel extending substantially perpendicular to said axis in space.

12. Apparatus according to claim 2, wherein said first carriage has a resting element for interacting with the other pigtail of each axially taped component, said resting element having a dimension in the direction of said axis in space such that said resting element protrudes above said resting surface when said first carriage is in said work position.

13. Apparatus according to claim 2, wherein said cutting means includes a knife and a mating cutter mounted on said first carriage remote from said bending mandrel for separating said axially taped components from said tape.

14. Apparatus according to claim 13, wherein said cutting means includes a second knife mounted on said second carriage remote from said bending mandrel with the cutting edges of said knives being on opposite sides of said bending mandrel, and a second mating cutter is associated with said second knife, said knives being operable to separate said components from said tape.

15. Apparatus according to claim 1, wherein a second work station is mounted on said machine frame, said transport means being operable to stepwise move bent components from said first work station to said second work station, pushing means at said second work station for bending a pigtail of a bent component, said pushing means being movable transverse to the direction of movement of said transport means from a position of rest to a working position, said pushing means having at least one bending tool with a shaping surface formed of a first projection which is movable in a direction transverse to the direction of movement of said pushing means, said first projection cooperating with said transport means to bend said pigtail when said pushing means is in said working position.

16. Apparatus according to claim 15, wherein said bending tool is pivotally mounted on said pushing means, said pushing means including a displaceable drive element connected to said bending tool via at least one spring means, said drive element having a pin which engages into a link guide means associated with said bending tool.

17. Apparatus according to claim 16, wherein said drive element is displaceable in the same direction as said pushing means and said link guide means is provided by an opening in said bending tool extending at least in a portion thereof obliquely to the direction of displacement of said pushing means.

18. Apparatus according to claim 17, wherein at least two bending tools are swingably mounted on said pushing means, said opening in one bending tool having a portion extending obliquely to the direction of displacement of said pushing means and a portion following the same which is parallel to said direction of displacement, and said opening in said other bending tool having a portion extending in the same direction parallel to the direction of displacement followed by a portion which extends obliquely to the direction of displacment.

19. Apparatus according to claim 18, wherein the portions of the two openings which extend obliquely to the direction of displacement are approximately parallel to each other.

20. Apparatus according to claim 15, wherein said pushing means includes at least one mating surface for said first projection which is formed of at least one second projection.

21. Apparatus according to claim 20, wherein said mating surface is provided in each case on both sides of the shaping surface.

22. Apparatus according to claim 20, wherein said first projection forms a mating surface associated with the forming surface of the other bending tool.

* * * * *